United States Patent [19]
Clement

[11] Patent Number: 5,457,441
[45] Date of Patent: Oct. 10, 1995

[54] INDUCTIVE AMPLIFIER HAVING TWO-TERMINAL AUTO-ON FUNCTION

[75] Inventor: Douglas S. Clement, Phoenix, Ariz.

[73] Assignee: Progressive Electronics, Inc., Mesa, Ariz.

[21] Appl. No.: 71,783

[22] Filed: Jun. 4, 1993

[51] Int. Cl.⁶ .................................................. G08B 21/00
[52] U.S. Cl. ......................... 340/657; 340/635; 324/66; 324/538
[58] Field of Search .................................. 340/635, 657; 324/66, 67, 557, 558; 379/21

[56] References Cited

U.S. PATENT DOCUMENTS

| | | | |
|---|---|---|---|
| D. 229,184 | 11/1973 | Brown et al. | D26/1 |
| D. 246,956 | 1/1978 | Perry | D10/4 |
| D. 251,548 | 4/1979 | Perry | D10/78 |
| D. 260,618 | 9/1981 | Koslar | D10/78 |
| D. 260,619 | 9/1981 | Koslar | D10/4 |
| D. 276,796 | 12/1984 | Allender, Jr. | D10/56 |
| D. 288,179 | 2/1987 | Sekido | D10/78 |
| D. 289,617 | 5/1987 | Yajima | D10/78 |
| D. 297,715 | 9/1988 | Lalley | D10/78 |
| 4,724,382 | 2/1988 | Schauerte | 324/133 |
| 5,144,657 | 9/1992 | Depaepe | 379/21 |

OTHER PUBLICATIONS

Progressive Electronics, Inc. Brochure "*Inductive Amplifier Model 200B Line-Aid*".
Progressive Electronics, Inc. Brochure "Alarm System Tester Model 61".
Progressive Electronics, Inc. Brochure "Inductive Amplifier Model 200EP".
Progressive Electronics, Inc. Brochure "Model 200B Inductive Amplifier", Issue 13, Mar. 1990.
Brochure for Triplett Corporation "Hound" Inductive Tracer.
Brochure for Aines Model 250SSP "Stationman Speaker Probe".

*Primary Examiner*—John K. Peng
*Assistant Examiner*—Edward Lefkowitz
*Attorney, Agent, or Firm*—Cahill, Sutton & Thomas

[57] ABSTRACT

An inductive amplifier for identifying and tracing wires is provided with a pair of threaded post terminals for being engaged by the electrical clips of a jumper wire or telecommunications butt set. The inductive amplifier includes a built-in speaker and a depressible power switch for applying power from a battery to a tone amplifier. A switching transistor couples the battery to the tone amplifier whenever a low impedance path is formed between the pair of threaded post terminals, even if the power switch is not depressed. The built-in speaker is connected in series with the threaded post terminals and is a.c. coupled to the tone amplifier for sounding the tone through either the built-in speaker or through a butt set engaged with the threaded post terminals. The impedance of the built-in speaker is selected to be less than that of the butt set for silencing the built-in speaker when the butt set is connected.

18 Claims, 2 Drawing Sheets

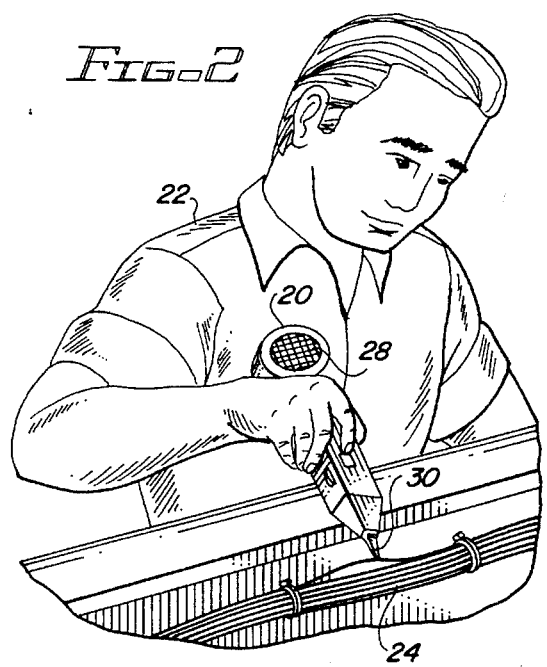
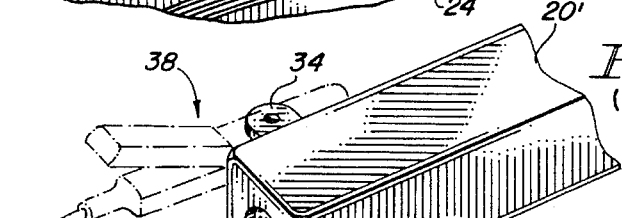
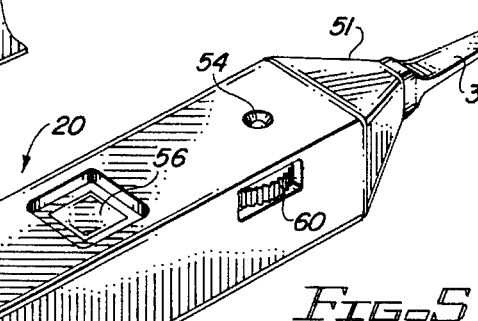
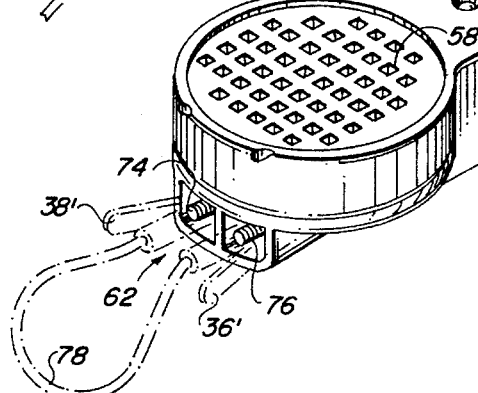
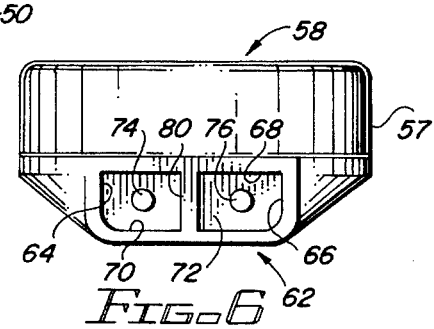

INDUCTIVE AMPLIFIER HAVING TWO-TERMINAL AUTO-ON FUNCTION

BACKGROUND OF THE INVENTION

1. Field of the Invention

The present invention relates generally to inductive amplifiers used to identify and trace a particular wire within a group of wires, and more particularly, to an inductive amplifier having a pair of terminals which can function to turn the amplifier on while simultaneously providing an amplified output signal to a telecommunications butt set.

2. Description of the Relevant Art

Inductive amplifiers, or tone detectors, are used by telecommunications service personnel to identify and trace a particular wire within a group or bundle of wires, without damaging the insulation surrounding each of such wires. Such inductive amplifiers are commonly used in conjunction with tone generators for tracing wires. The tone generator is coupled with a particular wire of interest to inject an audio frequency tone within such wire. The probe tip of the inductive amplifier is placed adjacent one of several wires to identify the particular wire conducting the injected audio tone. The inductive amplifier typically includes a built-in loudspeaker which can be used to produce an audible signal derived from the injected audio tone. In addition, the inductive amplifier typically includes a spring-biased pushbutton which may be depressed by a user to activate the amplifier and loudspeaker.

Several of the prior art inductive amplifiers which have been commercially available in the past have included a pair of ears extending from the housing of the inductive amplifier adjacent the end of the device opposite the probe tip. Examples of such prior art inductive amplifiers include the Aines Model 250SSP "Stationman" Speaker Probe sold by Aines Manufacturing Corp. of Ronkonkoma, N.Y., and the Model 200A "LineAid" inductive amplifier formerly sold by Progressive Electronics, Inc. of Mesa, Ariz., the assignee of the present invention. Each of the two ears includes a pair of electrically conductive plates extending parallel to each other and separated by a relatively thin insulator layer. By shorting the two opposing plates on one of such ears, the user can maintain the amplifier turned on without continually depressing the manually-operated pushbutton. The shorting of these two plates can be effected by applying an electrical alligator clip on such ear, simultaneously contacting both the upper and lower plates on such ear.

Telecommunications service personnel often carry upon their tool belt a rugged telephone handset having a pair of electrical alligator clips for connecting the handset to telephone wires to test communication lines. These service handsets are often referred to as "butt sets" in the industry, presumably because they have a hook for fastening the handset to a tool belt and tend to hang down along the service person's buttocks. The handset includes a microphone and an earphone, as well as a loudspeaker. When service personnel use inductive amplifiers, they often prefer to listen for the audible tone using their butt set. In those instances where a service person is working in cramped, noisy quarters, it may be difficult to hear the built-in loudspeaker clearly, and in this event, it is much easier for the service person to connect the butt set to the inductive amplifier, and to hold the butt set near his or her ear in order to monitor the tone.

As mentioned above, prior art inductive amplifiers have been provided with a pair of wings extending outwardly from the body of the amplifier housing. By applying one of the electrical alligator clips across the opposing plates of one of such wings, such plates are shorted together to turn the amplifier on. By applying the second electrical alligator clip of the butt set across the opposing electrical plates of the second wing, the butt set is electrically coupled into the output circuit of the amplifier for receiving the amplified audio output signal.

While such outwardly extending ears thereby serve to permit a service person to connect a butt set to such inductive amplifiers, such prior art inductive amplifiers are also subject to various disadvantages. For example, because such ears extend outwardly from both sides of the inductive amplifier housing and are relatively thin, they are often cracked or broken off altogether when the inductive amplifier is inadvertently dropped or bumped against another object. Moreover, because such ears have only a thin layer of insulation between the opposing conductive plates, moisture can sometimes bridge the gap between the two opposing plates and cause the inductive amplifier to drain current from the battery when not in use.

In addition, because such ears extend outwardly and are relatively flat, the electrical alligator clips of a butt set or shorting wire attached thereto are often inadvertently knocked off of such ears. Furthermore, because such ears project outwardly from the inductive amplifier housing, they are easily contacted by the hands of the user; while such contact poses no danger to the service person, the body of the service person acts like an antennae and picks up stray signals or feedback which can be introduced into the amplifier circuitry through such ears, causing false tones and/or oscillations to be heard by the user.

As indicated above, prior art inductive amplifiers provided with protruding ears include three or four conductive plates in order to facilitate the connection of a butt set to the inductive amplifier. However, the more electrical contacts that project from the inductive amplifier housing, the more likely it is that such contacts will be inadvertently shorted together or touched by a user's body to introduce oscillations.

Accordingly, it is an object of the present invention to provide an inductive amplifier adapted to be more easily connected with a telecommunications butt set while minimizing the likelihood that the electrical connectors of the butt set will be knocked loose from the inductive amplifier.

It is another object of the present invention to provide such an inductive amplifier adapted to be more easily connected with a shorting wire in order to maintain power to the amplifier without manual depression of a pushbutton while minimizing the likelihood that the electrical connectors of the shorting wire will be knocked loose from the inductive amplifier.

It is still another object of the present invention to provide such an inductive amplifier which minimizes the number of exposed electrical terminals extending from the housing of the amplifier while still permitting the connection of the aforementioned butt set or shorting wire thereto.

A further object of the present invention is to provide such an inductive amplifier which minimizes the likelihood of contact with the user's body to lessen the introduction of stray signals or oscillations into the inductive amplifier circuitry.

A still further object of the present invention is to minimize the likelihood of damage or breakage of exposed electrical terminals extending from the housing of the amplifier.

A yet further object of the present invention is to provide such an inductive amplifier which has less susceptibility to impaired performance due to contact with moisture.

These and other objects of the present invention will become more apparent to those skilled in the art as the description of the present invention proceeds.

SUMMARY OF THE INVENTION

Briefly described, and in accordance with a preferred embodiment thereof, the present invention provides an inductive amplifier for detecting and amplifying an electrical tone conducted by one of a group of wires in order to identify and trace a particular wire, wherein the inductive amplifier includes an amplifier having an input terminal coupled to a conductive probe. The conductive probe may be placed adjacent a wire under test for receiving an audio tone conducted by the wire under test and providing such audio tone as an input signal to the amplifier in order to generate an amplified output signal in response thereto. A battery is provided for supplying electrical power to the amplifier. A switching circuit is interposed between the battery and the amplifier. The inductive amplifier includes first and second electrical terminals extending therefrom for being engaged by first and second electrical clips, respectively, of a telecommunications butt set. These first and second electrical terminals each may be provided in the form of threaded cylindrical posts for being firmly engaged by electrical connection clips, thereby lessening the likelihood that such electrical clips will be knocked loose.

The switching circuit is electrically coupled to the first and second electrical terminals and functions to detect that a relatively low impedance path has been created between such first and second electrical terminals, as by engaging the first and second electrical clips, respectively, of a telecommunications butt set thereto. Alternatively, this low impedance path can be created by shorting wire, or jumper wire, clipped to such first and second electrical terminals. Upon detecting a low impedance path created between such first and second electrical terminals, the switching circuit then couples the battery to the amplifier. One of the first and second electrical terminals of the inductive amplifier is a.c. coupled to the amplified output signal generated by the amplifier for allowing the amplified output signal to be received by the telecommunications butt set. The amplified output signal created by the amplifier may then be heard as an audible tone in the earpiece of the butt set, assuming that such butt set is connected.

Preferably, the inductive amplifier includes a built-in loudspeaker electrically coupled to the amplifier for receiving the amplified output signal in order to provide an audible tone in response thereto when a butt set is not in use. The inductive amplifier also advantageously includes a depressible manual switch, for example, a pushbutton, for causing the battery to be coupled to the amplifier when the manual switch is depressed by a user. The manual switch is preferably coupled across the aforementioned first and second terminals to create the low impedance path therebetween when the switch is depressed. However, as explained above, the connection of a shorting wire or jumper wire across the first and second electrical terminals also creates a low impedance path therebetween and avoids the need to manually depress the pushbutton.

The built-in loudspeaker may be coupled in electrical series connection with the first and second electrical terminals. This connection provides the advantage of automatically silencing the built-in loudspeaker whenever the first and second electrical clips of the telecommunications butt set are engaged with the first and second electrical terminals, respectively, of the inductive amplifier. This silencing feature is achieved by making the impedance of the built-in loudspeaker significantly less than the impedance across the first and second electrical clips of the telecommunications butt set, whereby the smaller current drawn by the butt set is insufficient to adequately drive the built-in loudspeaker.

The switching circuit that selectively couples the battery to the amplifier preferably includes a transistor that selectively conducts current from the battery to the amplifier. The transistor is biased into conduction when a low impedance path is created across the first and second electrical terminals of the inductive amplifier. The biasing terminal of the transistor is coupled to one of the first and second electrical terminals, while the remaining electrical terminal is electrically coupled to the battery. Thus, when a low impedance path is created across the first and second electrical terminals, as by connecting the first and second electrical clips, respectively, of a butt set thereto, a biasing voltage is applied to the biasing terminal of the transistor in order to conduct current from the battery to the amplifier.

BRIEF DESCRIPTION OF THE DRAWINGS

FIG. 1 is a perspective view of an inductive amplifier constructed in accordance with the teachings of the present invention and electrically coupled with a telecommunications set for detecting an audio tone injected into one of several wires.

FIG. 2 is a perspective view of the same inductive amplifier used alone without a butt set.

FIG. 3 is a partial perspective view of a prior art inductive amplifier having outwardly extending ears, and indicating a pair of electrical alligator clips in dashed outline coupled thereto.

FIG. 4 is an end view of the prior art inductive amplifier shown in FIG. 3.

FIG. 5 is a perspective view of an inductive amplifier constructed in accordance with the teachings of the present invention.

FIG. 6 is an end view of the inductive amplifier shown in FIG. 5.

DETAILED DESCRIPTION OF THE PREFERRED EMBODIMENT

Figure 7:
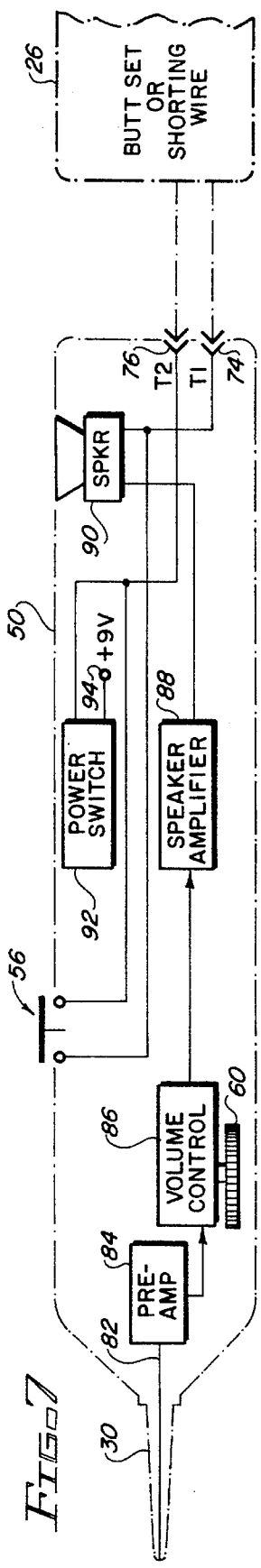
FIG. 7 is a block diagram of the electronic components contained by the inductive amplifier of FIG. 5.

FIGS. 1 and 2 generally illustrate two ways of using an inductive amplifier of the general type to which the present invention relates. Within FIGS. 1 and 2, the inductive amplifier is designated generally by reference numeral 20 and is held by a user 22 adjacent one of a group of wires 24. An electrical tone generator (not shown) is coupled to an end of one of such wires within group 24 to inject therein an audio frequency signal. Inductive amplifier 20 is used for identifying and tracing the particular wire within group 24 into which the aforementioned audio signal has been injected. Inductive amplifier 20 detects and amplifies the electrical tone conducted by the particular wire to which the tone generator has been coupled, and generates an audible tone signal indicating the presence of such injected signal to user 22.

As indicated within FIGS. 1 and 2, there are two general methods of operating inductive amplifier 20. In the method illustrated by FIG. 1, user 22 connects the terminals of a telecommunication handset, or butt set 26, and listens for the audible tone in the earpiece of butt set 26; butt set 26 may be, for example, of the type known as a TS-22 Harris Dracon Hand Set. In the second method, illustrated in FIG. 2, user 22 forgoes the use of a butt set, and simply listens for a tone emitted by a built-in loudspeaker 28 disposed within inductive amplifier 20 opposite probe tip 30. The present invention facilitates the use of such an inductive amplifier using either of such methods.

One form of prior art inductive amplifier is shown in FIGS. 3 and 4. Prior art inductive amplifier 20' includes a built-in speaker 28' and a pair of ears 32 and 34 extending outwardly in opposing directions from the body of the inductive amplifier generally proximate the end thereof lying opposite the probe tip (not shown in FIGS. 3 and 4). A pair of electrical alligator clips 36 and 38 are shown in dashed outline within FIGS. 3 and 4. Clips 36 and 38 might represent the electrical alligator clips of a butt set like that shown as 26 in FIG. 1. Attachment of clips 36 and 38 across ears 32 and 34 would, in the prior art inductive amplifier 20' turn the amplifier on and cause the amplified output signal to be heard through the earpiece of butt set 26.

Still referring to FIG. 4, ear 32 includes a layer of an electrically insulating support material 40, which may be of the same material from which printed circuit boards are made. Upper and lower opposing metal layers 42 and 44 lie on opposing faces of insulating layer 40. When electrical alligator clip 36 is attached over ear 32, it electrically shorts together upper and lower metal layers 42 and 44. Ear 34 is of a similar construction to that described for ear 32. Thus, for prior art inductive amplifier 20', there are typically four, or at least three, electrical conductors supported by ears 32 and 34. As mentioned above, these ears are easily broken or damaged if the unit is accidentally dropped or bumped against an object. Due to the relatively thin, flat shape of such ears, electrical alligator clips 36 and 38 are knocked loose from such ears relatively easily. In addition, as already mentioned, a user who inadvertently contacts such ears against his hand, wrist, or other portions of his body, can inject stray signals or oscillations into the inductive amplifier and attached butt set. Finally, because conductive metal layers 42 and 44 supported by ear 32 are disposed so close to each other, a small droplet of moisture bridging the insulator gap separating such metal layers is sufficient to create an inadvertent short across such metal layers, which can cause the unit to operate, and drain power from the battery, when the unit is not in use.

As mentioned above, among the objects of the present invention are to allow convenient connection with a telecommunications butt set or shorting wire while minimizing the likelihood that the electrical connectors of the butt set or shorting wire will be knocked loose from the inductive amplifier, and minimizing the number of exposed electrical terminals extending from the housing of the amplifier while still permitting the connection of the aforementioned butt set or shorting wire thereto. An inductive amplifier constructed in accordance with the present invention, and which achieves such objects, will now be described in greater detail in conjunction with FIGS. 5–8.

An inductive amplifier constructed in accordance with the present invention is shown in FIG. 5 and is again designated by reference numeral 20. The inductive amplifier includes an elongated outer plastic housing 50 for being gripped by a user, and extends between first and second opposing ends 51 and 57. Housing 50 may be conveniently formed of two mating upper and lower halves secured together by screws 52 and 54. The upper and lower halves of housing 50 may be conveniently formed of molded plastic. An electrically conductive probe 30 projects from one end of housing 50 for being placed adjacent a wire under test; probe tip 30 may be formed of a conductive plastic to avoid direct shorts of telephone equipment as might cause a failure in a home office. Contained within housing 50 is an electronic amplifier having an input terminal coupled to conductive probe 30 for receiving an input signal therefrom and for generating an amplified output signal; the structure and manner of operation of such amplifier are described in greater detail below. A battery is also disposed within housing 50 for supplying electrical power to the amplifier.

A manual switch in the form of a spring-biased pushbutton 56 is provided for causing a battery contained within housing 50 to be electrically coupled to an amplifier also contained within housing 50 when pushbutton 56 is depressed by a user. The end 57 of housing 50 opposite probe tip 30 houses a built-in loudspeaker which can emit amplified audio tones through a grill 58 formed at end 57 of housing 50. In addition, the peripheral edge of a circular volume control knob 60 projects from one side of housing 50 for allowing a user to control the volume of the audio signal amplified by inductive amplifier 20.

Those skilled in the art will appreciate that no ears extend from the sides of housing 50. Instead, the outer surface of housing 50 opens inwardly into a recessed area 62 proximate second end 57 of housing 50. Recessed area 62 is defined by internal sidewalls 64 and 66, upper internal wall 68, and lower internal wall 70, each of which extends generally parallel to the longitudinal axis of housing 50. Recessed area 62 is also bounded by a recessed back wall 72 which extends approximately one-half inch back from the rearmost peripheral edge of end 57 of housing 50.

As shown in FIGS. 5 and 6, first and second electrical terminals 74 and 76 extend from back wall 72 and within recessed area 62 parallel to each other and to internal walls 64–70. First and second electrical terminals 74 and 76 are each provided as a threaded cylindrical post for being firmly engaged by electrical connection clips. Each of terminals 74 and 76 extends proximate the outer periphery of end 57 of housing 50, preferably extending fully to the outer periphery of housing 50, but no further. The internal walls 64–70 of recessed area 62 generally surround first and second electrical terminals 74 and 76 and are spaced therefrom by a sufficient distance to permit electrical clips of a shorting wire or electrical clips of a telecommunications butt set to be engaged over first and second electrical terminals 74 and 76 within recessed area 62. Within FIG. 5, a shorting wire 78 is shown in dashed outline, and it will be noted that the electrical alligator clips 36' and 38' of shorting wire 78 are easily inserted within recessed area 62 over terminals 76 and 74, respectively.

Accordingly, in view of the threaded cylindrical surfaces of terminals 74 and 76, and because such terminals are positioned within recessed area 62, electrical alligator clips secured to such terminals are not easily knocked loose. In addition, because terminals 74 and 76 are recessed within housing 50, they are not easily broken off or damaged, even if inductive amplifier 20 is dropped. Moreover, because electrical terminals 74 and 76 are sheathed by walls 64–70, it is much less likely that a user will inadvertently contact a portion of his body with such terminals as might introduce stray signals or oscillations.

As shown in FIGS. 5 and 6, the preferred embodiment of the present invention further includes a central dividing wall 80 for dividing recessed area 62 into first and second recessed portions, wherein first electrical terminal 74 is disposed within a first recessed portion bounded by internal walls 64, 68, 70, and 80, while the second electrical terminal 76 is disposed within the second recessed portion bounded by internal walls 66, 68, 70, and 80. Central dividing wall 80 is spaced from both first and second electrical terminals 74 and 76 by a sufficient distance to permit electrical clips of a shorting wire or butt set to be engaged over first and second electrical terminals 74 and 76 within the first and second recessed portions. Central dividing wall further minimizes the likelihood that terminals 74 and 76 will inadvertently be shorted to each other, as by permitting the electrical alligator clips of a butt set from contacting each other.

As mentioned above, one of the objects of the present invention is to provide an inductive amplifier that may be conveniently connected with a telecommunications butt set or shorting wire, and at the same time minimizing the number of exposed electrical terminals that extend from the inductive amplifier housing. It is desired to retain the ability to activate the inductive amplifier by using a shorting wire or jumper wire without requiring the user to depress pushbutton 56. It is also desired to retain the ability to both activate the inductive amplifier (without requiring the user to depress pushbutton 56) and to hear the amplified tone in the butt set merely by connecting the butt set to the inductive amplifier terminals.

Those skilled in the art will appreciate that, within the inductive amplifier described thus far in conjunction with FIGS. 5 and 6, only two electrical conductors, i.e., terminals 74 and 76, are accessible from housing 50, compared with three or four electrical terminals provided on the projecting ears of prior art inductive amplifiers. The manner by which the number of electrical terminals can be reduced to only two terminals while retaining the aforementioned desired features will become more apparent below in conjunction with the description of FIGS. 7 and 8.

Within FIG. 7, housing 50 is represented by dashed lines 50, while butt set 26 is represented by dashed lines 26. Probe tip 30 is represented as including a conductor 82 for conducting a detected signal to an input terminal of preamp stage 84. The output of preamp stage 84 passes through a volume control circuit 86 to which volume control knob 60 is coupled for controlling the amplitude of the amplified signal. The output of volume control circuit is then passed to the input of speaker amplifier 88 which further amplifies the audio tone detected by probe tip 30. The output of speaker amplifier 88 is electrically coupled to one terminal of built-in speaker 90 for receiving the amplified output signal and providing an audible tone in response thereto. The second terminal of speaker 90 is connected to first electrical terminal 74 that extends within recess 62 (see FIGS. 5 and 6).

Second electrical terminal 76, which also extends within recess 62 (see FIGS. 5 and 6) is coupled to a power switching circuit 92. Thus, speaker 90 is coupled in electrical series connection with first and second electrical terminals 74 and 76. Power switching circuit 92 is also coupled to a 9 Volt battery, represented by power supply terminal 94. Whenever power switching circuit 92 is triggered, it allows the battery to be electrically coupled with preamp stage 84 and speaker amplifier 88 for activating inductive amplifier 20.

Power switching circuit 92 is configured to be triggered whenever a relatively low impedance path is created across electrical terminals 74 and 76. Thus, for example, manual pushbutton switch 56 includes a first electrical lead connected to terminal 74 and a second electrical lead connected to terminal 76. When pushbutton switch 56 is depressed by a user, it shorts terminal 74 to terminal 76, thereby triggering power switching circuit 92. Likewise, if a user connects a shorting wire 78 (see FIG. 5) across terminals 74 and 76, a low impedance path is created across such terminals, thereby triggering power switching circuit 92 even if the user does not depress pushbutton 56.

Alternatively, if the leads of a butt set 26 are connected across terminals 74 and 76, then an impedance of only approximately 200–300 ohms is applied across terminals 74 and 76. This relatively low impedance is sufficient to trigger power switching circuit 92 to couple battery 94 to the amplifier circuitry, while at the same time permitting the amplified audio output signal to be coupled to the earpiece of the butt set. Thus, power switching circuit 92 effectively detects that the first and second electrical clips 36 and 38 (see FIG. 3) of the telecommunications butt set have been engaged with the first and second electrical terminals 74 and 76 for selectively coupling the battery to the amplifier.

Still referring to FIG. 7, it will be noted that terminals 74 and 76 are in series connection with built-in speaker 90. Accordingly, when butt set 26 is connected to terminals 74 and 76, butt set 26 is in series connection with built-in speaker 90. As stated above, the typical impedance of the butt set input is between 200–300 ohms; in contrast, the impedance of built-in speaker 90 is on the order of only 8 ohms, which is significantly less than the impedance across the first and second electrical clips of the telecommunications butt set. While the impedance of butt set 26 is sufficiently low to trigger power switching circuit 92, it is sufficiently greater than the 8 ohm impedance of speaker 90 to greatly reduce the operating current flowing through speaker 90 in comparison to the amount of operating current which flows through speaker 90 when pushbutton 56 is depressed. Thus, the inductive amplifier of the present invention effectively silences built-in speaker 90 whenever the first and second electrical clips 36 and 38 of the telecommunications butt set 26 have been engaged with the first and second electrical terminals 74 and 76 of the inductive amplifier 20.

Figure 8:
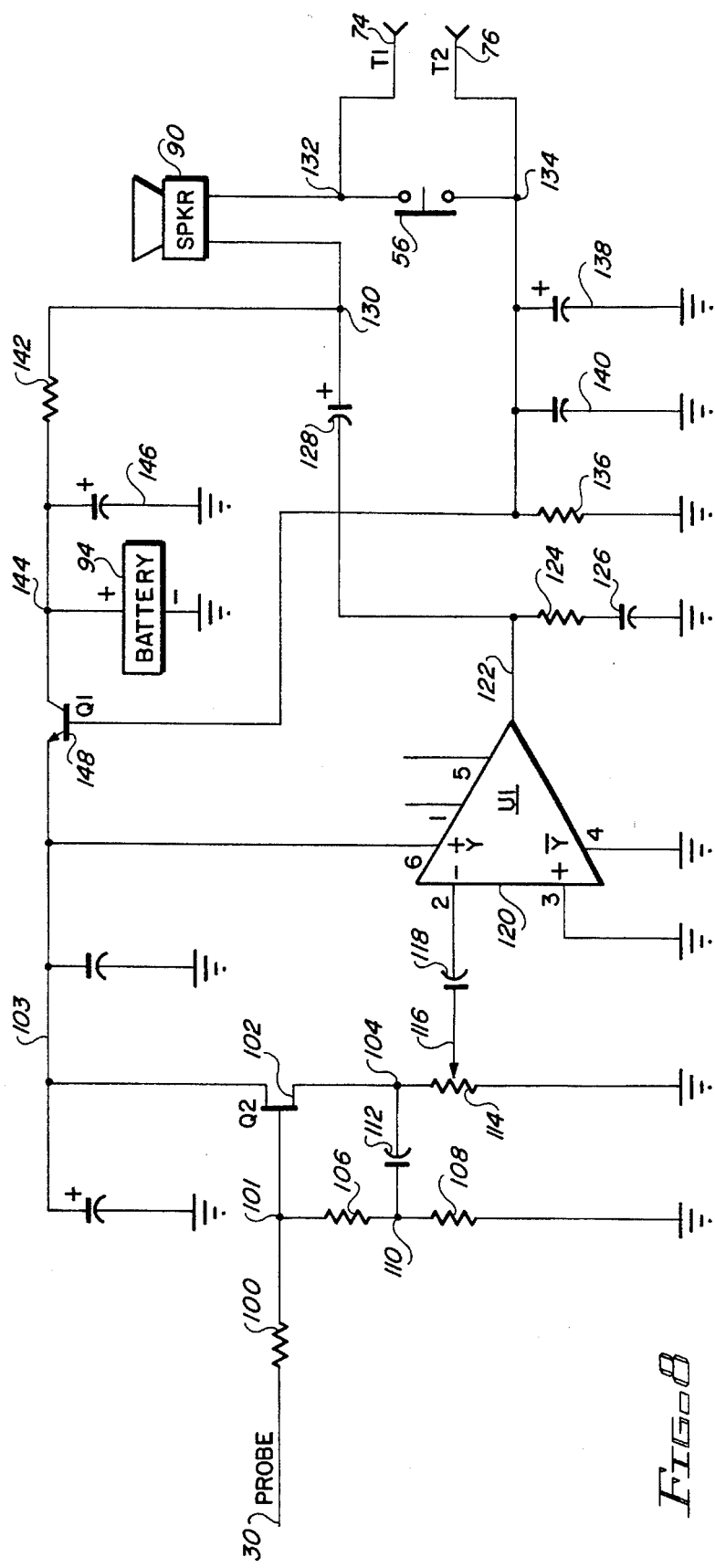
FIG. 8 is a circuit schematic of the electronic components contained within the inductive amplifier of FIG. 5.

Referring to the circuit schematic of FIG. 8, probe tip 30 is coupled through resistor 100 to node 101. Resistor 100 preferably has a value of one Megaohm. Node 101 is coupled to the gate of field effect transistor 102 which may be of the type commercially available under Model MPF102. The drain terminal of FET 102 is coupled to a switched power supply conductor 103. The source terminal of FET 102 is coupled to node 104. A bias network extends from node 101 to ground through a resistive divider network including resistors 106 and 108. Resistor 106 is coupled between node 101 and node 110. Resistor 108 is coupled from node 110 to ground potential. Resistor 106 has a value of 1.5 Megaohm, and resistor 108 has a value of 1 Megaohm. Transistor 102, together with input resistor 100 and biasing resistors 106 and 108 comprise a preamplifier stage as represented by block 84 within FIG. 7. In addition, capacitor 112 is coupled between nodes 110 and 104, and preferably has a value of 0.001 μfarad.

Node 104 is coupled to ground potential through a center-tapped resistor 114 having a value of 10K ohms. The center tap 116 of resistor 114 effectively serves as the volume control represented by block 86 in FIG. 7. Center tap 116 of variable resistor 114 is coupled through capacitor 118 to an inverting input terminal (pin 2) of an operational amplifier 120; capacitor 118 has a value of 0.015 μfarads. Operational amplifier 120 is of a type commercially available under Model No. LM386. The positive voltage terminal (pin 6) of operational amplifier 120 is coupled to the switched positive supply conductor 103. The negative supply terminal (pin 4) of operational amplifier 120 is coupled to ground potential. In addition, the positive input terminal (pin 3) of op amp 120 is also coupled to ground potential. The output terminal 122 (pin 6) of op amp 120 is coupled through a.c. load resistor 124 and capacitor 126 to ground. Resistor 124 has a value of 10 ohms; capacitor 126 has a value of 0.1 μfarads. Output terminal 122 of op amp 120 is a.c. coupled by capacitor 128 (100 μfarads) to node 130. Node 130 is further coupled to a first terminal of built-in speaker 90. As indicated above, speaker 90 has an impedance of approximately 8 ohms. The second terminal of speaker 90 is coupled to node 132, which is in turn coupled to electrical terminal 74 that extends within recessed area 62 (see FIG. 5). The second recessed electrical terminal 76 is coupled to node 134.

Node 134 is coupled to ground through d.c. biasing resistor 136, which has a nominal value of 39K ohms. Node 134 is also a.c. coupled to ground via capacitor 138, which has a value of 100 μfarads. In addition, an a.c. filter capacitor 140 extends between node 134 to minimize high-frequency oscillations at node 134. Manual switch 56 extends between nodes 132 and 134 and creates a short between such nodes whenever the user manually depresses the pushbutton switch.

The above described op amp 120, together with load resistor 124 and capacitor 126, comprise the speaker amplifier 88 shown in FIG. 7. The amplified output signal generated at output terminal 122 of op amp 120 is a.c. coupled through capacitor 128 to speaker 90, and through speaker 90 to recessed terminal 74. Consequently, the amplified output signal is emitted as an audible tone from speaker 90 whenever switch 56 is depressed, or whenever terminals 74 and 76 are shorted by a jumper wire. Likewise, coupling the terminals of butt set 26 across recessed terminals 74 and 76 effectively a.c. couples the butt set between the speaker amplifier and ground.

As mentioned above in regard to FIG. 7, power switching circuit 92 selectively couples battery 94 to the amplifier circuitry whenever switch 56 is depressed, or whenever a low impedance path is detected across recessed terminals 74 and 76. Referring to FIG. 8, node 130 is coupled by d.c. biasing resistor 142 to the positive supply terminal 144 of 9 Volt battery 94; biasing resistor 142 has a nominal value of 1.5K ohms. An a.c. filter capacitor 146, having a value of 100 μfarads, extends between positive supply terminal 144 and ground to stabilize the voltage at terminal 144. Switching transistor 148 is an NPN transistor of the type commercially available under part number 2N3904. The collector of transistor 148 is connected to positive supply terminal 144, and thus, to battery 94. The emitter of transistor 148 is connected to switched power supply conductor 103. The base terminal of transistor 148 is connected to node 134.

Transistor 148 is selectively biased into a conductive mode for selectively conducting current from battery 94 to switched power supply conductor 103 in order to power the preamplifier stage and speaker amplifier. More particularly, assuming that pushbutton switch 56 is depressed, current flows from battery 94 through bias resistor 142, through speaker 90, and through switch 56, to ground through bias resistor 136; it will be recalled that speaker 90 has an almost negligible impedance of 8 ohms. The base-emitter junction of transistor 148 thereby becomes forward-biased, rendering transistor 148 conductive. If switch 56 is released, the biasing current stops, node 134 falls back to ground potential, and transistor 148 is rendered non-conductive. Applying a shorting wire across recessed terminals 74 and 76 has the same effect as depressing switch 56.

Alternatively, if the electrical clips of butt set 26 are applied across recessed terminals 74 and 76, an impedance of from 200–300 ohms is thereby placed in series with biasing resistor 142, which has a value of 1.5K ohms. The additional series impedance of the butt set is almost insignificant in comparison with the values of resistance for biasing resistors 142 and 136. Accordingly, sufficient biasing current reaches the base terminal of transistor 148 to forward-bias transistor 148 in order to conduct current from battery 94 to the amplifier components.

Those skilled in the art will now appreciate that an inductive amplifier has been described which provides only two recessed electrical terminals that are easily connected to a butt set for both turning the inductive amplifier on, as well as allowing the amplified audio tone to be played through the earpiece of the butt set. The same two recessed terminals may also be engaged by the clips of a shorting wire to maintain the inductive amplifier turned on without requiring depression of a manual pushbutton switch. By minimizing the number of exposed electrical terminals, and by increasing the distance between such terminals, the described inductive amplifier lessens the likelihood of damage to exposed contacts, and decreases the susceptibility to impaired performance due to moisture bridging such exposed contacts. By providing only two exposed terminals as threaded posts, the described inductive amplifier minimizes the likelihood that butt set connector clips will be knocked loose from such terminals, and also decreases the possibility for stray signals or oscillations to be injected into the amplifier.

While the present invention has been described with respect to a preferred embodiment thereof, such description is for illustrative purposes only, and is not to be construed as limiting the scope of the invention. Various modifications and changes may be made to the described embodiment by those skilled in the art without departing from the true spirit and scope of the invention, as defined by the appended claims.

I claim:

1. An inductive amplifier for detecting and amplifying an electrical tone conducted by one of a group of wires in order to identify and trace a particular wire, said inductive amplifier comprising in combination:

a. an electrically conductive probe for being placed adjacent a wire under test;

b. an amplifier having an input terminal coupled to said conductive probe for receiving an input signal therefrom and generating an amplified output signal, said amplifier further including an output terminal for providing the amplified output signal;

c. a battery for supplying electrical power to said amplifier;

d. a first electrical terminal for being engaged by a first electrical clip of a telecommunications butt set;

e. a second electrical terminal for being engaged by a second electrical clip of the telecommunications butt set;

f. switching means having a first node electrically coupled to said first electrical terminal and having a second node electrically coupled to said second electrical terminal, said switching means functioning to detect that a d.c. biasing current is flowing between the first node and the second node through the telecommunications butt set for selectively coupling said battery to said amplifier; and g. one of said first and second nodes being a.c. coupled to the output terminal of said amplifier for providing the amplified output signal to one of said first and second electrical terminals and for conducting an a.c. signal current between the first node and the second node through the telecommunications butt set for allowing said electrical tone to be heard via the telecommunications butt set.

2. The inductive amplifier recited by claim 1 further including a built-in loudspeaker electrically coupled to said amplifier for receiving the amplified output signal and providing an audible tone in response thereto, said inductive amplifier also including a manual switch for causing said battery to be coupled to said amplifier when said manual switch is operated by a user.

3. The inductive amplifier recited by claim 2 wherein said switching means also serves to silence said built-in loudspeaker whenever the first and second electrical clips of the telecommunications butt set have been engaged with said first and second electrical terminals of said inductive amplifier.

4. The inductive amplifier recited by claim 2 wherein said switching means also serves to maintain said battery in electrical coupling with said amplifier whenever a shorting connection is applied by a user across said first and second electrical terminals of said inductive amplifier, whether or not the user operates said manual switch.

5. The inductive amplifier recited by claim 1 wherein said switching means includes a transistor for selectively conducting current from said battery to said amplifier, said transistor being biased to conduct current when the first and second electrical clips of the telecommunications butt set have been engaged with said first and second electrical terminals of said inductive amplifier.

6. The inductive amplifier recited by claim 5 wherein said transistor includes a biasing terminal coupled to one of said first and second electrical terminals, and wherein the remaining one of said first and second electrical terminals is electrically coupled to said battery, whereby the connection of the first and second electrical clips of the telecommunications butt set with said first and second electrical terminals of said inductive amplifier allows a biasing voltage to be applied to the biasing terminal of said transistor in order to electrically couple said battery to said amplifier.

7. The inductive amplifier recited by claim 2 wherein said switching means includes a transistor for selectively conducting current from said battery to said amplifier, said transistor being biased to conduct current when the first and second electrical clips of the telecommunications butt set have been engaged with said first and second electrical terminals of said inductive amplifier.

8. The inductive amplifier recited by claim 7 wherein said transistor includes a biasing terminal coupled to one of said first and second electrical terminals, and wherein the remaining one of said first and second electrical terminals is electrically coupled to said battery, whereby the connection of the first and second electrical clips of the telecommunications butt set with said first and second electrical terminals of said inductive amplifier allows a biasing voltage to be applied to the biasing terminal of said transistor in order to electrically couple said battery to said amplifier.

9. The inductive amplifier recited by claim 8 wherein said built-in loudspeaker is coupled in electrical series connection with said first and second electrical terminals.

10. The inductive amplifier recited by claim 9 wherein the impedance of the built-in loudspeaker is significantly less than the impedance across the first and second electrical clips of the telecommunications butt set, whereby the built-in loudspeaker is silenced whenever the first and second electrical clips of the telecommunications butt set have been engaged with said first and second electrical terminals of said inductive amplifier.

11. The inductive amplifier recited by claim 7 wherein said transistor includes a biasing terminal coupled to one of said first and second electrical terminals, and wherein the remaining one of said first and second electrical terminals is electrically coupled to said battery, whereby the connection of an electrical short applied by a user across said first and second electrical terminals of said inductive amplifier allows a biasing voltage to be applied to the biasing terminal of said transistor in order to electrically couple said battery to said amplifier, whether or not the user operates said manual switch.

12. The inductive amplifier recited by claim 11 wherein said built-in loudspeaker is coupled in electrical series connection with said first and second electrical terminals.

13. The inductive amplifier recited by claim 2 wherein said manual switch electrically couples said first and second electrical terminals of said inductive amplifier to each other when said manual switch is operated by a user.

14. The inductive amplifier recited by claim 1 wherein said first and second electrical terminals of said inductive amplifier each include threaded cylindrical posts for being firmly engaged by electrical connection clips.

15. The inductive amplifier recited by claim 1 wherein at least one of said first and second electrical terminals of said inductive amplifier is a.c. coupled to the amplified output signal generated by said amplifier for allowing said amplified output signal to be received by the telecommunications butt set in order to provide an audible tone in response thereto.

16. The inductive amplifier recited by claim 15 further including a built-in loudspeaker electrically coupled in series connection with said first and second electrical terminals of said inductive amplifier for receiving the a.c. coupled amplified output signal, said inductive amplifier also including a manual switch for causing said battery to be coupled to said amplifier when said manual switch is operated by a user for causing said built-in loudspeaker to provide an audible tone in response to the amplified output signal generated by said amplifier.

17. The inductive amplifier recited by claim 16 wherein the impedance of the built-in loudspeaker is significantly less than the impedance across the first and second electrical clips of the telecommunications butt set, whereby the built-in loudspeaker is silenced whenever the first and second electrical clips of the telecommunications butt set have been engaged with said first and second electrical terminals of said inductive amplifier.

18. The inductive amplifier recited by claim 16 wherein said manual switch electrically couples said first and second electrical terminals of said inductive amplifier to each other when said manual switch is operated by a user.

\* \* \* \* \*